(12) United States Patent
Czarny et al.

(10) Patent No.: US 9,012,788 B2
(45) Date of Patent: Apr. 21, 2015

(54) OPTRONIC WINDOW TRANSPARENT TO IR AND REFLECTING RF

(75) Inventors: Romain Czarny, Chatillon (FR);
Jean-Luc Reverchon, Paris (FR);
Michel Pate, Nozay (FR); Brigitte Loiseaux, Bures sur Yvette (FR);
Gérard Berginc, Thiais (FR)

(73) Assignee: Thales, Courbevoie (FR)

( * ) Notice: Subject to any disclaimer, the term of this patent is extended or adjusted under 35 U.S.C. 154(b) by 205 days.

(21) Appl. No.: 13/885,651

(22) PCT Filed: Nov. 15, 2011

(86) PCT No.: PCT/EP2011/070139
§ 371 (c)(1),
(2), (4) Date: Jul. 2, 2013

(87) PCT Pub. No.: WO2012/065987
PCT Pub. Date: May 24, 2012

(65) Prior Publication Data
US 2014/0146511 A1    May 29, 2014

(30) Foreign Application Priority Data
Nov. 16, 2010 (FR) .................................. 10 04448

(51) Int. Cl.
*H05K 9/00* (2006.01)
*H05K 1/02* (2006.01)
(Continued)

(52) U.S. Cl.
CPC ............ *H05K 9/0058* (2013.01); *H05K 1/0274* (2013.01); *G02B 5/204* (2013.01); *G02B 5/207* (2013.01); *G02B 2207/121* (2013.01); *H01L 31/1016* (2013.01); *H01L 31/109* (2013.01); *H05K 9/0094* (2013.01)

(58) Field of Classification Search
CPC .................................................... H05K 1/0274
See application file for complete search history.

(56) References Cited

U.S. PATENT DOCUMENTS 5,173,443 A    12/1992  Biricik et al.
6,099,970 A     8/2000  Bruno et al.
(Continued)

FOREIGN PATENT DOCUMENTS

EP      1087242 A1    3/2001
FR      2793106 A1   11/2000
(Continued)

OTHER PUBLICATIONS

H.W. Ott, "Electromagnetic Compatibility Engineering", 2009, pp. 288-290, John Wiley and Sons, Hoboken, NJ, USA, XP002644548.
(Continued)

*Primary Examiner* — Jeremy C Norris
(74) *Attorney, Agent, or Firm* — Baker Hostetler LLP

(57) ABSTRACT

An optronic porthole comprises a substrate with two faces. It comprises on one of the faces of the substrate or on both faces, a stack of several hetero-structures, each hetero-structure being composed of at least two semi-conducting layers SC1, SC2, the layer SC1 being doped, the layer SC2 itself comprising a two-dimensional electron gas layer formed at the interface with the layer SC1. It furthermore comprises an electrode in contact with all the electron gas layers, a bi-periodic metallic grid buried in the stack, in contact with the electrode. The substrate and the layers are transparent in the 0.4 µm-5 µm band.

10 Claims, 7 Drawing Sheets

(51) Int. Cl.
  *G02B 5/20* (2006.01)
  *H01L 31/101* (2006.01)
  *H01L 31/109* (2006.01)

(56) References Cited

U.S. PATENT DOCUMENTS

| | | | |
|---|---|---|---|
| 2003/0087048 | A1 | 5/2003 | Chaussade et al. |
| 2007/0071970 | A1 | 3/2007 | Koike et al. |
| 2008/0174872 | A1 | 7/2008 | Morimoto et al. |
| 2011/0043887 | A1 | 2/2011 | Valentin et al. |

FOREIGN PATENT DOCUMENTS

| | | |
|---|---|---|
| FR | 2928463 A1 | 9/2009 |
| GB | 2329527 A | 3/1999 |
| JP | 1-170098 A | 7/1989 |

OTHER PUBLICATIONS

Vladimir I. Litvinov, et al., "Conductive Coating with Infrared Pass Band", Proceeding of SPIE, 2000, pp. 38-45, vol. 4094, XP002644552.

Nuphar Lipkin, et al., "Dual Band Transparent Conductive Coating", Proceedings of SPIE, 2001, pp. 315-321, vol. 4375, XP002644553.

Armour, E. et al., "LED growth compatibility between 2', 4' and 6' sapphire," Semiconductor TODAY Compounds & Advanced Silicon, vol. 4, Issue 3, pp. 82-86 (2009).

Bernardini, F. et al., "Spontaneous polarization and piezoelectric constants of III-V nitrides," Physical Review B, vol. 56, No. 16, pp. R10 024-R10 027 (1997).

Dubreuil, D. et al., "Optical and electrical properties between 0.4 and 12 μm for Sn-doped In2O3 films by pulsed laser deposition and cathode sputtering," Applied Optics, vol. 46, No. 23, pp. 5709-5718 (2007).

Emerson, W. H., "Electromagnetic Wave Absorbers and Anechoic Chambers Through the Years," IEEE Transactions on Antennas and Propagation, vol. AP-21, No. 4, pp. 484-490 (1973).

Etienne, B. et al., "Reduction in the concentration of DX centers in Sidoped GaAlAs using the planar doping technique," Appl. Phys. Lett. 52, pp. 1237-1239 (1988).

Gonschorek, M. et al., "High electron mobility lattice-matched AlInN/GaN field-effect transistor heterostructures," Applied Physics Letters, vol. 89, pp. 062106-1-062106-3 (2006).

"Taiwan's sapphire substrate suppliers thrive on hot LED market. (light emitting diode) (Brief article) Jan. 5, 2010," pp. 1-4, at http://www.highbeam.com/doc/1G1-216485345.html, printed on May 29, 2013.

Huang, G. S. et al., "Crack-free GaN/AlN distributed Bragg reflectors incorporated with GaN/AlN superlattices grown by metalorganic chemical vapor deposition," Applied Physics Letters, vol. 88, pp. 06104-1-06104-3 (2006).

Khan, M. et al., "GaN/AlN digital alloy shortperiod superlattices by switched atomic layer metalorganic chemical vapor deposition," Appl. Phys. Lett. 63, pp. 3470-3472 (1993).

Knott, E. F. et al., "Performance Degradation of Jaumann Absorbers due to Curvature," IEEE Transactions on Antennas and Propagation, vol. AP-28, No. 1, pp. 137-139 (1980).

LED lighting market to reach $1 billion in 2011 (Feb. 2, 2007), LEDs Magazine at http://www.ledsmagazine.com/news, printed on Apr. 2, 2011, one page.

Lewis, E. A. et al., "Electromagnetic Reflection and Transmission by Gratings of Resistive Wires," J. Appl. Phys., vol. 23, pp. 605-608 (1952).

Documentation commercial of Picogiga, "GaN Thin Epiwafers for discrete power devices, RF & microwave components."

Documentation of "Vussil Shielded Windows," manufactured by the company Jaques Dubois.

Ressler, G. M. et al., "Far Infrared Bandpass Filters and Measurements on a Reciprocal Grid," Applied Optics, vol. 6, No. 5, pp. 893-896 (1967).

Schneider, M. V., "Schottky Barrier Photodiodes with Antireflection Coating," The Bell System Technical Journal, pp. 1611-1638 (1966).

Wang, L. et al., "Highly efficient blue organic light emitting device using indium-free transparent anode Ga:ZnO with scalability for large area coating," J. Appl. Phys., vol. 107, pp. 43103-1-43103-8 (2010).

Zhang, J. P. et al., "Crack-free thick AlGaN grown on sapphire using AlN/AlGaN superlattices for strain management," Appl. Phys. Lett., vol. 80, No. 19, pp. 3542-3544 (2002).

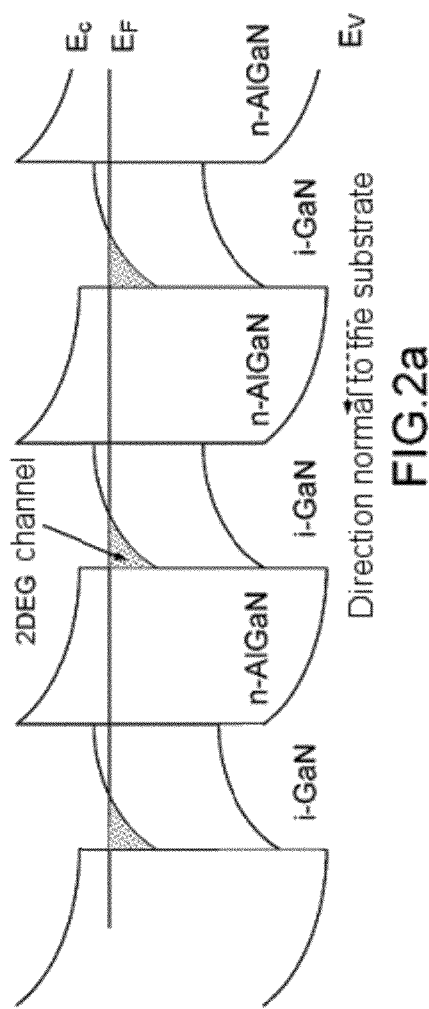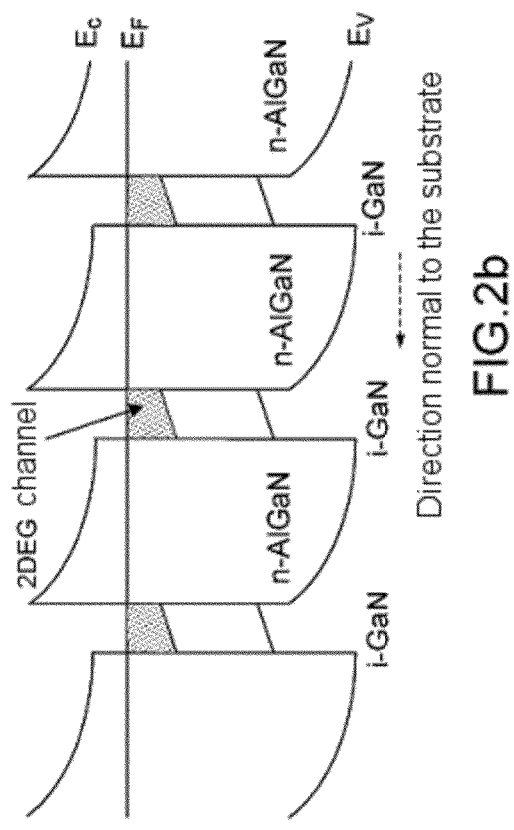

OPTRONIC WINDOW TRANSPARENT TO IR AND REFLECTING RF

CROSS-REFERENCE TO RELATED APPLICATIONS

This application is a National Stage of International patent application PCT/EP2011/070139, filed on Nov. 15, 2011, which claims priority to foreign French patent application No. FR 1004448, filed on Nov. 16, 2010, the disclosures of which are incorporated by reference in their entirety.

FIELD OF THE INVENTION

The field of the invention is that of the Electro-Magnetic Compatibility (EMC) of the optronic equipment mounted aboard aircraft (laser telemeter, LIDAR, VIS/IR camera, optronic equipment for aiding landing, etc.).

Indeed, the presence of optical windows on this type of equipment exposes the interior of these devices to the surrounding electromagnetic waves and vice versa. The term optical window designates the whole of a transparent porthole embedded in a mechanical structure; a porthole typically has a diameter of 15 to 40 cm. This exposure to electromagnetic waves may have the following consequences:
- the disturbance of the operation of the optronic device,
- the disturbance of the operation of the various surrounding electronic equipment (radar, radio communication, etc.).

The use of a transparent optical window in the optical wavelength range used (300 nm to 20 µm) and reflecting to RF waves (1 MHz to 100 GHz) makes it possible to ensure electrical continuity at the level of the carcass of the equipment and thus to constitute a Faraday cage. The optronic window is then nontransparent in the RF band.

BACKGROUND

Today, three techniques are chiefly employed so as to achieve the combination of the 2 sought-after effects: optical transparency and microwave reflectivity/absorption.

A first technique consists in associating with the optical porthole a metallic grid of the same dimension.

From a microwave frequency point of view, this grid behaves as a high-pass frequency filter whose performance is related to the size of the wires of the grid, to its pitch and to the nature of the metal used (generally gold or copper). Indeed, for wavelengths which are large in relation to the pitch of the grid and for thicknesses of penetration of the electromagnetic field (so-called skin thicknesses) that are smaller than the grid wire thickness, the grid is seen as a uniform and therefore reflecting metallic layer.

From an optical point of view, the wires of the grid behave as diffracting elements. For a given wavelength, it is the effectiveness of diffraction determined by the periodicity of the grid as well as by the size of the wires relative to the wavelength considered, which will determine the optical losses. For example, a copper grid with a wire diameter of 30 µm and with a regular mesh cell (a pitch) of 224 µm exhibits an optical transparency in the visible of 78%.

The performance of such devices is limited chiefly by technological limitations. Indeed, when the grid must be mechanically self-supported, its wire diameter and its pitch may not be reduced beyond the limits of resistance of the materials; the optical diffraction then becomes too significant.

Let us also point out the existence of bi-periodic grids implementing semi-conducting materials and making it possible to couple the incident RF wave impinging on an absorbent layer.

Another technique employed consists in depositing on the optical porthole, a transparent conducting layer. To this end, metals deposited in a fine layer or doped oxides are commonly employed (or in a thin layer, ITO, ZnO). For microwave frequencies, the semi-transparent layer behaves like a metal making it possible to uniformly reflect the waves whose frequency is below the plasma frequency. This technique is typically employed on airplane or helicopter canopies.

Though this technique may be satisfactory in the visible (notably for all applications related to viewing), such is not the case for wavelengths above 1.5 µm where, when the layer is sufficiently conducting with a surface resistance of typically less than 10Ω (sheet resistance), the IR waves are strongly reflected and/or absorbed. The typical conductivities are of the order of about ten ohms (sheet resistance) for a transmission of 40% at 1.5 µm.

Finally a third technique, different from the other two, implements a frequency-selective surface of the Salisbury screen type, with optically compatible materials.

This type of surface consists of a partially reflecting microwave frequency diopter, of a substrate of an effective thickness of $\lambda/4$, followed by a highly reflecting RF surface. Thus, the RF reflections on the first diopter are coupled in phase opposition with the reflection on the highly reflecting diopter thus giving rise to a decrease in the RF reflectivity of the porthole.

These reflecting surfaces can be produced with the aid of grids or of semi-transparent layers as presented previously.

This type of filter is effective only for a narrow frequency band. Techniques exist for widening the operating band of this type of device (Jaumann screen for example); however, they lead to the production of relatively thick structures.

Consequently, there remains to date a need for a porthole that is simultaneously satisfactory for all the aforementioned requirements, in terms of good IR transmission, low RF transmission and good mechanical resistance.

SUMMARY OF THE INVENTION

The invention is based on the use of a transparent substrate between 0.4 and 5 µm associated with a stack of hetero-structures, each hetero-structure comprising semi-conducting layers of high forbidden band energy (typically greater than 1 eV) and mobile electric carriers with a mobility of typically greater than 100 $cm^2/V/s$.

The use of semi-conducting layers of high forbidden band energy confers good IR transparency of greater than 90%; its thickness of the order of 10 µm as well as the high mobility of the carriers of greater than 100 $cm^2/V/s$ guarantee its conductivity and therefore its RF reflectivity.

More precisely the subject of the invention is an optronic porthole which comprises a substrate with two faces. It is chiefly characterized in that it comprises on one of the faces of the substrate or on both:
- a stack of several hetero-structures, each hetero-structure being composed of at least two semi-conducting layers SC1, SC2, the layer SC1 being doped, the layer SC2 itself comprising a two-dimensional electron gas layer formed at the interface with the layer SC1, and
- an electrode in contact with all the electron gas layers.

The presence of the two-dimensional electron channels of 2DEG type ("Two-Dimensional Electron Gas") makes it possible to increase the mobility of the carriers in the structure and therefore to increase the RF reflectivity and the IR transparency.

Optionally, it furthermore comprises a bi-periodic metallic grid in contact with the electrode, which can be buried in the stack. It generally has regular mesh cells. It typically has a wire with a thickness of less than 5 μm and a pitch of less than 500 μm.

According to a characteristic of the invention, the semiconducting layer SC2 is undoped.

According to another characteristic of the invention, the hetero-structures are of different thickness and/or are not composed of the same materials and/or do not comprise the same number of layers.

This porthole typically comprises a stack of 10 to 80 hetero-structures.

It can comprise a buffer layer between the substrate and the stack of hetero-structures, as well as one or two antireflection layers.

The substrate is in general made of Sapphire or SiC or Si, the layer SC2 is made of GaN and the layer SC1 of AlGaN with an Al concentration of between 25 to 30%.

Epitaxy of the GaN on Sapphire makes it possible to produce windows of very high mechanical strength and thermal resistance (strong covalent bond between Ga and N giving rise to the high forbidden band energy: between 3.2 and 3.4 eV). The growth temperature of greater than 1000° C. affords it high thermal stability.

The subject of the invention is also an optronic window which comprises a porthole such as described embedded in an electrically conducting mechanical structure, the electrode of the porthole being linked to this electrically conducting structure.

BRIEF DESCRIPTION OF THE DRAWINGS

Other characteristics and advantages of the invention will become apparent on reading the detailed description which follows, given by way of nonlimiting example and with reference to the appended drawings in which.

From one figure to the next, the same elements are labeled with the same references.

DETAILED DESCRIPTION

Figures 1A, 1B:
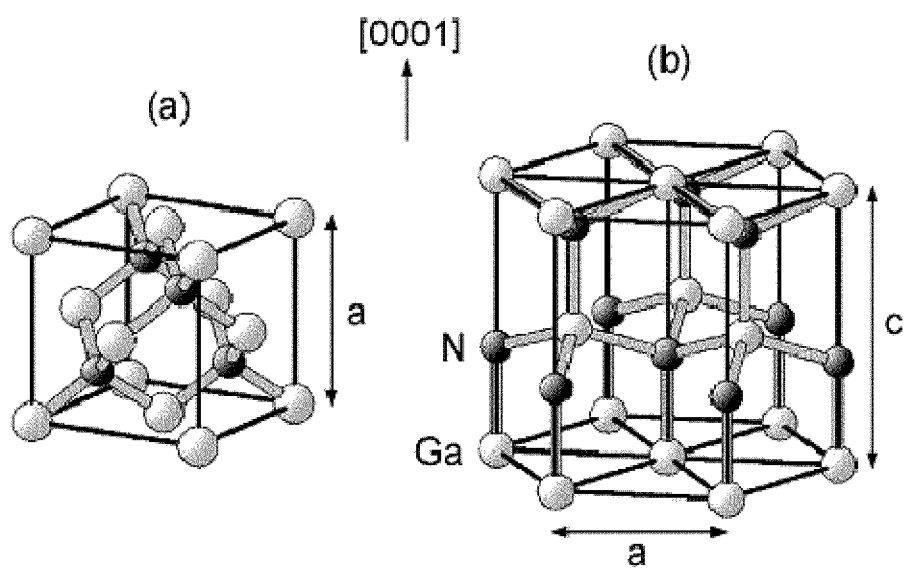
FIG. 1 schematically represent a crystalline GaN structure, cubic and non-polar of Zinc Blende type (FIG. 1a) and hexagonal and polar of Würtzite type (FIG. 1b), FIG. 2 schematically represent an energy band structure of the network of hetero-structures allowing parallel placement of 2DEG channels of high mobility, as a function of the direction normal to the substrate, for a typical network width of greater than 100 nm (FIG. 2a) and less (FIG. 2b), FIG. 3a gives the total network thickness required as a function of the mean density of carriers in the network to obtain an RF transmission varying between −10 and −50 dB for a mobility of 1500 cm²/V/s, FIG. 3b gives the absorption connected with the free carriers at λ=4.5 μm as a function of the density of carriers in each channel for the same mobility, FIG. 4 schematically represent a porthole according to the invention, produced on circular substrate in perspective (FIG. 4a), viewed from above (FIG. 4b), according to a cross section AA with a stack of three hetero-structures (FIG. 4c), FIG. 5 give the optical reflection, transmission and absorption coefficients (FIG. 5a) and the RF transmission (FIG. 5b) obtained for a porthole with 80 hetero-structures totaling 8 μm in thickness, comprising a grid with a pitch of 400 μm and gold wires of 5×5 μm², FIG. 6 schematically represents an optronic window according to the invention.

According to a first embodiment of the invention, a substrate possessing the required transparency between 0.4 and 5 μm and of very good physical and mechanical properties, such as sapphire, is associated with a stack of hetero-structures comprising semi-conducting layers of high forbidden band energy and mobile carriers. Among the semi-conducting layers used may be cited for example a semi-conducting GaN layer; GaN having the particular feature of being able to grow with good crystallographic quality on sapphire, this method thus makes it possible to obtain a structure of very high mechanical and thermal resilience.

The behavior of the GaN layer depends on the density of free carriers as well as on their mobility. On the basis of these two quantities and of the intrinsic properties of the material, it is possible to define a characteristic quantity called the plasma frequency $f_p$ (it corresponds to the electromagnetic frequency for which the real part of the permittivity of the material is zero):

$$f_p = \frac{1}{2\pi}\sqrt{\frac{n_e q^2}{\varepsilon_0 \varepsilon_R m_{\it eff}} - \frac{q^2}{m_{\it eff}^2 \mu_e^2}}$$

with $n_e$ the carrier density, $m_{\it eff}$ their effective mass and $\mu_e$ the mobility of these carriers, q the electric charge on the electron, $\varepsilon_0$ the permittivity in vacuo, $\varepsilon_R$ the relative permittivity of the material considered. This frequency can be associated with a wavelength termed the plasma wavelength $\lambda_p$:

$$\lambda_p = \frac{c}{f_p}$$

with c the speed of light in vacuo.

Thus, the behavior of the semi-conducting GaN layer depends on the wavelength considered:

For electromagnetic wavelengths below $\lambda_p$ (IR waves and the visible in our case) this layer will behave as a dielectric and therefore be traversed with losses. The transparency of the material in this wavelength range will depend notably on the density of free carriers and on their mobility in the GaN structure.

For wavelengths above $\lambda_p$ (RF waves in our case), this layer will behave as a metal and create a short circuit from a radiofrequency point of view. The incident wave is therefore reflected, the performance depends on the quality of the short circuit produced and therefore the surface resistivity of the GaN layer.

The incident wave is reflected all the more the more conducting the layer, that is to say it comprises a high density of free carriers (greater than $10^{18}$ cm$^{-3}$), and a high mobility (greater than 100 cm²/V/s). We will then have an optronic window which is non-transparent to RF waves.

The optical characteristics of the semi-conducting layer are recalled. Those which are related to the interactions with the free carriers can be described with the aid of the Drude model. On the basis of the intrinsic parameters of the material as well as those of the carriers (density, effective mass and mobility) it is possible to calculate as a function of wavelength, the complex permittivity $\varepsilon = \varepsilon_1 + i\varepsilon_2$ and the complex index N=n−ik of the material. For a wavelength λ, the optical lineal losses α, which are connected with the absorption by free carriers are then related to the complex part of the index according to:

$$\alpha = \frac{4\pi}{\lambda}k$$

The optical transmission $T_{opt}$ and optical absorption $A_{opt}$ (related to a single traversal, without consideration of the reflections at the interfaces) of the semi-conducting layer of thickness d is therefore given by:

$$T_{Opt}=e^{-\alpha d} \text{ and } A_{Opt}=1-e^{-\alpha d}$$

The microwave frequency characteristics of the semi-conducting layer are recalled:

For small thicknesses d relative to the skin thickness, the radiofrequency characteristics of the semi-conducting layer are notably determined by its surface resistance $R_S$.

$$R_S = \frac{1}{dn_e\mu_e q}$$

For a self-supporting layer, the RF transmission can then be given by the following formula:

$$T_{RF} \approx -20\log\left(1 + \frac{60\pi}{R_S}\right)$$

in dB.

The problem issue of the growth of GaN on a sapphire substrate is now considered.

Growth is most commonly carried out along the c-axis of the Wurtzite crystalline structure on a sapphire substrate of orientation [0001]. Nonetheless, devices with a c-axis non-perpendicular to the substrate (in the plane for a non-polar structure or along semi-polar directions (x, y, z)) are gradually appearing.

One of the problem issues with the growth is related to the mesh cell mismatch between the various materials making up the hetero-epitaxy. GaN growth on a sapphire substrate ($Al_2O_3$) is then carried out with a horizontal crystalline axis (a) rotated by 30° with respect to the substrate.

The differences in expansion coefficient also contribute to the mechanical problems during growth performed in the vicinity of 1000° C. The data for various types of materials are charted in the following table for semi-conductors from the III-N family with Wurtzite structure.

| Material | Mesh cell parameter(A) | Expansion coefficient K−1 |
|---|---|---|
| Al2O3 | 4.7558 | 7.5 × 10−6 |
| Al2O3 (30°)/√3 | 2.74 | |
| GaN | 3.189 | 5.59 × 10−6 |
| AlN | 3.112 | 4.2 × 10−6 |
| InN | 3.548 | |
| BN | 2.2556 | |

One of the main growth techniques implemented to transcend this mesh cell mismatch is the use of a buffer layer a few tens of nanometers thick, epitaxied at low temperature (between 450 and 600° C.). It makes it possible to adapt the mesh cell parameter to that of III-N semi-conductor (GaN or AlN preferably).

This technique makes it possible to carry out epitaxies at high temperature (above 1000° C.) with a suitable mesh cell parameter and crystalline orientation. This yields layers of very good optical transparency. The typical surface roughness is less than 5 nm RMS (the acronym standing for the expression Root Mean Square for standard deviation).

Another technique, well known from the literature, consists in producing for example a multilayer of AlN/GaN binaries so as to trap the "through" dislocations at the interface between these layers. These multi-layers make it possible in one fell swoop to create two-dimensional electron gases that can contribute to the electrical conductivity as will be seen.

Indeed, in a massive semi-conductor, the mobility is therefore related to the density of defects and therefore to the doping: the higher the doping the lower the mobility. In quite another field from that of electromagnetic compatibility, namely that of HEMT transistors ("High-Electron-Mobility-Transistors), one of the techniques used to increase the mobility of the carriers, consists in:

physically dissociating the doped zone from the transport zone so as to limit the density of impurities in the transport zone and therefore to optimize the mobility of the carriers, positioning the Fermi level above the conduction band in the transport zone so as to create there a zone where free carriers (confined in 2 dimensions) are present in high density.

This is carried out with the aid of a hetero-junction which makes it possible to create a two-dimensional channel, called a 2DEG ("Two-Dimensional Electron Gas"), where the mobility and the density of the carriers are very high. With respect to simple massive layers, this type of heterojunction therefore makes it possible to produce assemblies of much lower electrical resistivity.

Since the electrical conduction takes place in the plane of the layers, TEM polarized incident RF waves are therefore liable to interact with the "gas" of free electrons of the 2DEG.

The functions required for microelectronics are very different from those which concern us here. Although the use of an electron gas is also employed in microelectronics, the placing of a large number of conduction channels in parallel (in parallel planes) does not apply to microelectronics.

The basic principle of the invention consists in stacking this type of heterostructure one above the other on the substrate so as to constitute a network of two-dimensional gases making it possible to produce a heterostructure with:

an even lower overall resistivity than in a massive semi-conductor, by placing the set of channels in parallel and an increased IR transparency by virtue of the high mobility of the carriers in the 2DEG layers.

In the case of an AlGaN/GaN heterojunction of hexagonal and polar crystalline structure of Würtzite type, or cubic and non-polar of Zinc Blende type (presented in FIGS. 1a and 1b respectively), the carriers are generally provided by the residual or intentional doping present; a piezo-electric effect makes it possible to polarize the junction naturally and to fill the channel. In the case of a network of several heterojunctions, this piezo-electric effect is insufficient to fill the set of channels on the basis of carriers arising from the surface. It is therefore proposed to dope the AlGaN barriers locally (that is to say only over a part of the thickness of the barrier) according to an n-doping or optionally a p-doping, and preferably periodically.

The amount of aluminum used (typically between 25 and 30%) makes it possible to guarantee two-dimensional epitaxial growth. In contradistinction to microelectronics applications (transistor notably), the absence of cracks and also electrical isolation between layers is not required. This noticeably eases the production of this type of structure.

When the typical width of the period of the network is greater than 100 nm, it is possible to achieve channels which have the same profile as those encountered in transistors of HEMT type. This type of network is presented in FIG. 2a, where $E_f$ designates the Fermi level, $E_c$ the conduction band energy, $E_v$ the valence band energy.

When the channels become narrow (<100 nm), an energy band architecture of multi-quantum-well type is then achieved, where the electrons present in the well can be distributed over discrete energy levels. This type of network is presented in FIG. 2b.

Though this type of structure is akin to the structures of QWIP infrared detectors, the acronym standing for the expression Quantum Well Infrared Photodetector, the manner of operation and the use are completely different. Indeed, the IR optical wave at normal incidence (having regard to the optical index of GaN, the maximum incidence in this layer is 25°) exhibits a polarization oriented parallel to the plane of the layers. Thus this wave does not interact with the discrete energy levels in the quantum wells and there is no optical absorption (as in QWIPs) related to intra- or inter-sub-band transitions. This polarization involves, however, an interaction with the "two-dimensional gases" of free electrons confined in the plane of the layers, and this may be manifested by an optical absorption connected with the free carriers.

In the same manner, a TEM RF wave at normal incidence excites these "two-dimensional gases" and interacts, having regard to the thickness of the structure relative to the RF wavelength, with an equivalent single layer of very good electrical conductivity.

The incident optical wave for its part sees this network as a layer with effective index equivalent to the average of the indices of the structure, weighted by the thicknesses. Indeed, the thickness of the layers (of the order of a few tens of nanometers) is much smaller than the shortest of the optical wavelengths considered (~400 nm). What is more, the difference in optical index between two materials of the (Al,Ga)N family is very small (less than 0.2) and induces little interference.

The mobility in the channels depends in large part on the band architecture adopted, and traditional techniques for optimizing mobility in these 2DEG structures can be used:

optimization of the width of the channels, optimization of the (energy-related) depth of the channels, optimization of the doping of the barriers, use of undoped zones, optionally of different composition in proximity to the channels, use of buffer layers on the substrate, etc. . . .

To safeguard the IR transparency performance, this optimization must be done while limiting the density of carriers $n_{2DEG}$ in the channels. Indeed, a drop in IR transmission is obtained when the densities of carriers in the channels lead to the obtaining of a shorter plasma wavelength than the IR wavelength $\lambda_{IR}$ considered:

$$n_{2DEG} < \varepsilon_0 \varepsilon_R \left( \frac{4\pi^2 m_{eff} c^2}{\lambda_{IR}^2 q^2} \right)$$

Thus, for a maximum IR wavelength of 4.5 µm, the carrier density in the channels is limited to ~6.10$^{19}$ cm$^{-3}$.

Figure 3A:
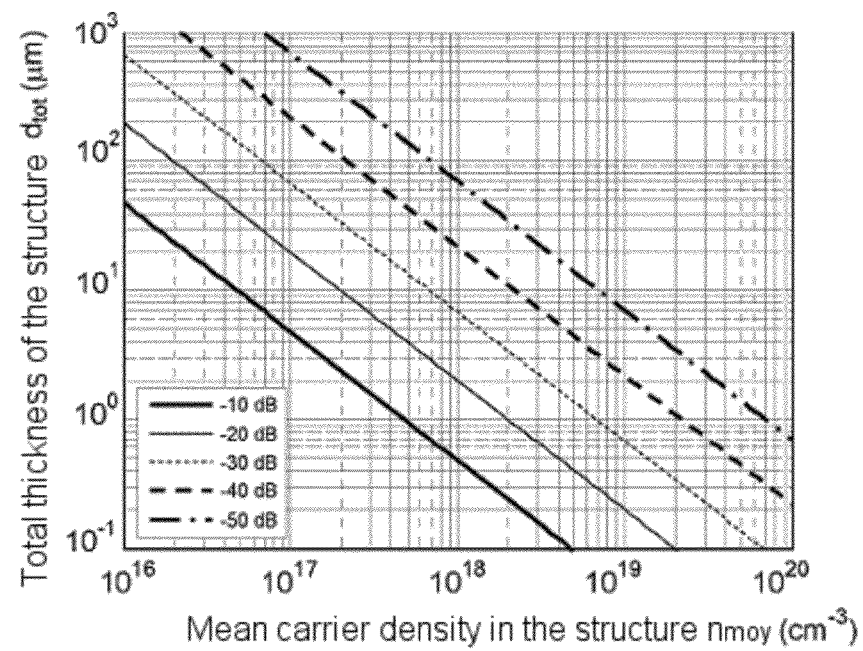

FIG. 3a represents the total thickness $d_{tot}$ of the network that must be achieved for a mobility of 1500 cm²/V/s in the channels; mobilities of 1900 cm²/V/s are offered in commercially marketed structures. This thickness is represented as a function of the mean doping $n_{moy}$ in the network as a whole and for various sought-after values of RF reflectivity.

Figure 3B:
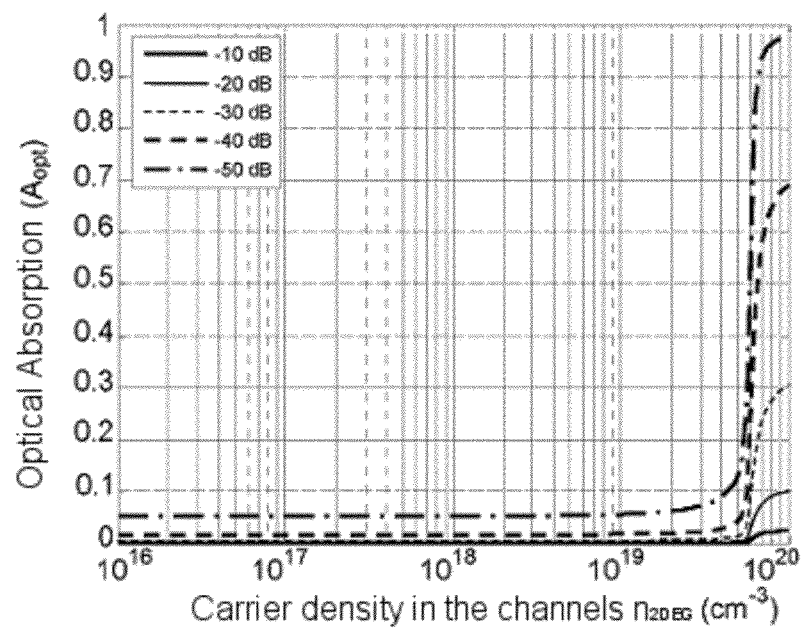

As a function of the network architecture adopted, the density of carriers $n_{2DEG}$ in the channels can vary for one and the same mean carrier density. As a function of this carrier density and by considering a total structure thickness in accordance with FIG. 3a, it is possible to calculate the IR absorption connected with the free carriers in the channels. These results are represented in FIG. 3b for an IR wavelength of 4.5 µm.

Furthermore an electrode is formed so as to be in contact with all the electron gas layers. It is intended to be electrically linked to the electrically conducting mechanical structure in which the porthole is embedded.

According to another embodiment, a metallic grid is integrated into the porthole such as described previously. This integration can be done by burying the grid in an epi-structured semi-conducting layer or by depositing the grid on the surface.

This grid behaves as a high-pass filter in the RF domain. The diameter of the deposited wires is small so as to limit the optical occultation. The size of the mesh cell of the grid depends on the required cutoff frequency.

Having regard to the refractive index of the GaN layer (~2.3) the proportion of optical rays which is diffracted in the substrate with angles of greater than 25° are filtered since they remain trapped by total internal reflection.

The pattern of the grid can be deposited in a pseudo-random or aperiodic manner so as to avoid the creation of diffraction orders.

The grid wire diameter must be greater than the depth of penetration of the electromagnetic field in the metal (skin thickness δ) which depends on the low frequency at which the device has to be used:

$$\delta = \frac{1}{\sqrt{f}} \frac{1}{\sqrt{\pi \kappa \mu_0 \mu_R}}$$

with $\mu_0$ the permeability in vacuo and $\mu_R$ the relative permeability of the material.

For example, at 1 GHz, for a gold wire (conductivity κ=45.2 10$^6$ S/m $\mu_R$=1), the skin thickness δ is 2.3 µm.

This embodiment combines the RF isolation performance of the grids for low frequencies (high-pass filter) and the performance of the epi-structured semi-conducting layer at high frequency.

Figure 4A:
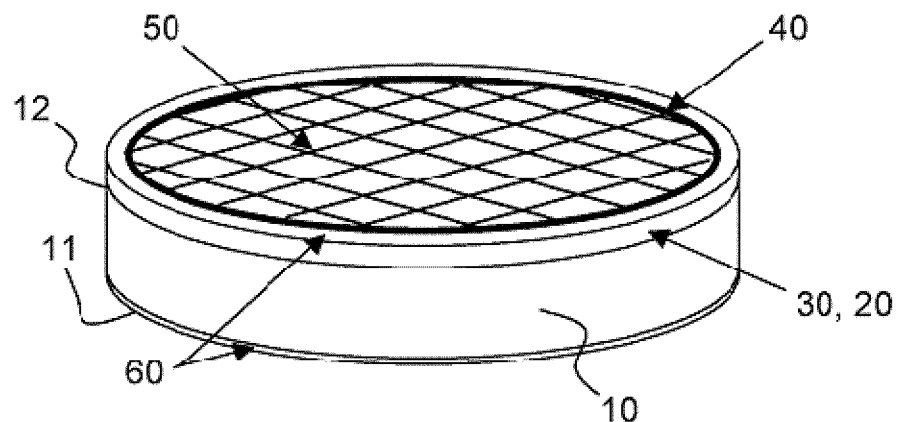
Figure 4B:
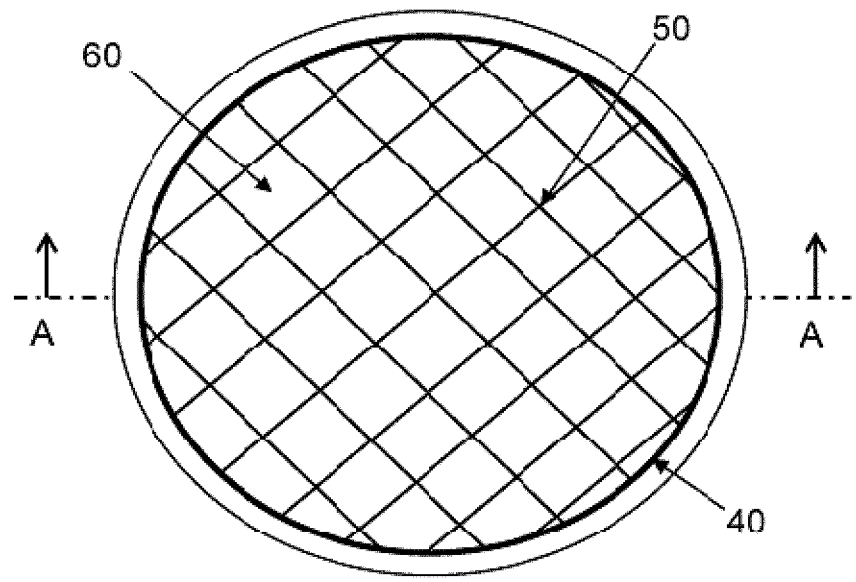
Figure 4C:
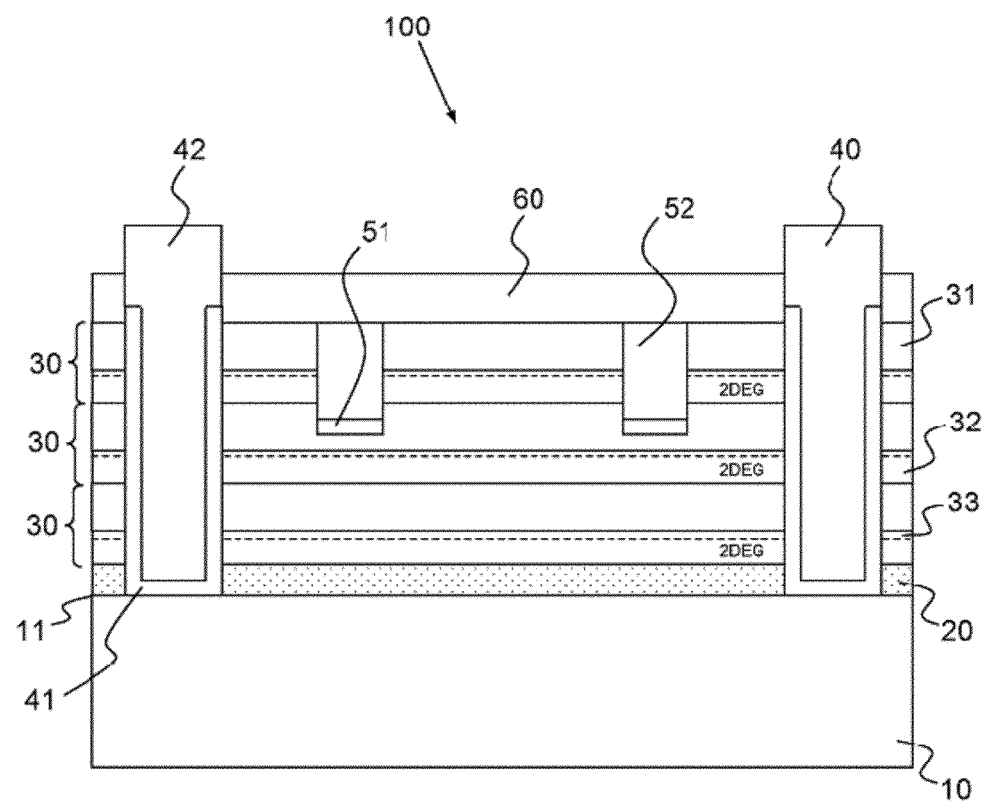

We shall now describe in conjunction with FIG. 4, an exemplary embodiment of a porthole 100 according to this second embodiment, with a metallic grid buried in the network of hetero-structures. In this example all the hetero-structures (three) are identical although this is not necessary as will be seen further on; the semi-conducting layer SC1 is n-AlGaN, the undoped semi-conducting layer SC2 is GaN, but here again other examples of materials will be given.

There is firstly carried out on the basis of a plane substrate 10 (not necessarily having symmetry of revolution), one of whose faces 11 is polished with an optical quality and the other 12 polished with a quality compatible with growth by epitaxy (so-called epi-ready face). This substrate may be sapphire, optionally c-oriented, or silicon for embodiments at 1.06 μm in band II, at 1.55 μm in band III, or SiC to go from the visible up to band III. It may also involve a host substrate such as obtained with the "Smart Cut" technology which consists chiefly in transferring onto a host substrate optionally of large dimension, separately fabricated heterostructures whose initial substrate has been removed.

A buffer layer 20, can be deposited beforehand on the epi-ready side: optionally a layer of GaN or AlN a few nanometers thick (from 20 to 50 nm) and epitaxied at low temperature (of the order of 450 to 600° C.) followed by a layer of GaN or GaAlN of a few microns (~2 μm) epitaxied at high temperature (above 1000° C.).

Directly on the substrate 10 or on this buffer layer 20, a stack of GaN/AlGaN heterostructures 30 is epitaxied in such a way as to form several 2DEG channels 33 one above the other. Preferably, the GaN layers SC2 32 are not doped. The AlGaN barrier layers SC1 31 are n-doped periodically (optionally with Silicon). In the figure is represented a stack of layers GaN/n-AlGaN; it would be possible to invert it and produce a stack of layers n-AlGaN/GaN.

Optionally, the thicknesses of each of the barriers may be slightly different from one another so as to avoid the creation of a structure of Bragg mirror type.

The number of semi-conducting layers and the materials may vary from one hetero-structure to the other.

The doping density in the AlGaN barriers 31, their thickness, the thickness of the GaN layers 32 as well as the total size of the epitaxied structure depend on the performance required in terms of overall electrical resistance of the layer and the optical transparency required in the band of interest.

The step of producing the electrode 40 and the grid 50 will now be described.

On the epi-structured face, an opening is made, optionally as far as the substrate 10, over the whole of the periphery of the sample and over the whole of the depth of the GaN/AlGaN network. It is ensured that the etching allows firm contact on its flanks.

A second etching reusing the pattern of the grid to be deposited is performed. The depth and the width of the etching depend on the size of the wires 50 of the grid to be deposited, and therefore the RF performance sought. As shown in FIGS. 4a and 4b, it is ensured that the pattern of the grid used regains the opening at the periphery so as to ensure electrical continuity between the grid and the electrode after metallization.

Ohmic contacts 41 and 42 are deposited at the bottom of the two openings and then annealed. Optionally these contacts may be based on Ti/Al/Ni/Au, on Ti/Al/Mo/Au, on Ti/Al/Ir/Au, etc. High-temperature annealing (of the order of 800° C.) makes it possible to obtain electrical contact of good quality. In FIGS. 4a and 4b, the grid is bi-periodic with a regular mesh cell (same period along both axes), but the two periods may be different.

Another metallic deposition 42 can be carried out so as to thicken and optionally widen the contact 41. This contact can be produced on the basis of Ti/Au followed by an electrolytic recharge of Au. The electrode 40 is thus composed of an ohmic contact 41 and of this other metallic deposition 42.

Another metallic deposition 52 can be carried out so as to thicken and optionally widen the contact 51. This contact can be produced on the basis of Ti/Au followed by an electrolytic recharging of Au. Advantageously, the thickness of the metal thus deposited does not exceed the height of the heterostructure so as to effectively protect the grid. The grid wires 50 are thus composed of an ohmic contact 51 and of this other metallic deposition 52.

The electrode 40 obtained makes it possible to ensure electrical contact with the 2DEG channels 33 of GaN and thus to ensure electromagnetic continuity between the porthole 100 and its mechanical support acting as electrical reference. This thick metallization which makes it possible to pick up the electrical contact on the porthole can also cover the mechanical support in which it is embedded. Thus, it becomes possible to ensure the electrical continuity of the porthole by contacting it from the side.

Antireflection layers 60 can be deposited on each of the two faces of the porthole (optionally solely on the grid side face or solely on the face 11 of the substrate) so as to reduce the optical reflections at the interfaces, at the wavelengths of interest and avoid the formation of Fabry-Perot cavities (related to the GaN/sapphire interface notably). Each of these 2 layers 60 can be independently optimized, the indices of sapphire (~1.8) and of AlGaN (~2.3) being different. Optionally, these layers 60 can be based either on dielectrics or semi-conductors with large gap (such as diamond, TiO2, MgF$_2$, ZnS, or others . . . ) or be based on nano-structured sub-lambda materials; optionally it may involve the heterostructure directly.

An opening is made in the antireflection layers (epi-structured side) so as to allow access to the thickened peripheral contact 40.

According to a simpler variant embodiment, the grid is not buried but deposited at the surface, on the stack or on the anti-reflection layer. Of course, to produce a porthole without metallic grid, the previous steps are implemented without the step of second etching.

According to another variant embodiment, the stack of heterostructures is not epitaxied but transferred onto the epi-ready face of the substrate.

Yet other variants can be carried out:

The GaN can be replaced with a III-N semi-conductor such as:

AlN (higher forbidden band energy than GaN: Eg=6.2 eV i.e. λg=200 nm) thereby making it possible to extend the transparency of the semi-conducting layer into the near UV. By extension, all the compositions of $Al_xGa_{1-x}N$ which make it possible to position the forbidden band energy between 6.2 eV and 3.4 eV.

InN (lower forbidden band energy than GaN: Eg=0.65 eV i.e. λg=1.9 μm). This makes it possible to cut off the visible and the near infrared up to 2 μm, to improve the density of carriers and their mobility. By extension, all the compositions of $In_xGa_{1-x}N$ which make it possible to position the forbidden band energy between 3.2 eV and 0.65 eV.

the materials of the family $Al_xIn_yGa_{1-x-y}N$ the materials of the family $Al_xIn_yGa_{1-x-y}As_zN_{1-z}$.

diamond, notably nano-crystalline or nano-structured.

The hetero-structure GaN/AlGaN can be replaced with a semi-conductor from the II-VI family (ZnO, MgZnO).

A III-N semi-conductor (cf the list of materials cited previously) can be used to produce the 2DEG channels and the different barriers SC1 of GaN and of AlGaN.

A semi-conductor from the II-VI family (ZnO, MgZnO) can be used instead of the GaN/AlGaN network.

A Salisbury screen can be produced with the aid of a stack of hetero-structures such as described previously, on either side of the sapphire window. For an interferometric effect at 10 GHz, the sapphire thickness ($\epsilon_R=11.58$) can be 2.2 mm (i.e. $\lambda/4$) or 6.61 mm (i.e. $3\lambda/4$). The GaN layer at the front face must exhibit a reflectivity of 50% (i.e. a surface resistance of the order of 450Ω (sheet resistance)). The rear face of the device must exhibit the highest possible reflectivity.

The advantages of the porthole according to the invention with respect to the aforementioned state of the art are as follows:

- Technological compatibility between the conducting layer giving the RF properties and a substrate of interest for Visible and IR optical applications by virtue of direct epitaxy on sapphire substrate.
- Transparency in the visible and IR band (from 0.4 μm up to 5 μm).
- Very low IR absorption and large RF reflectivity by virtue of the high mobility of the carriers in the 2DEG channels.
- Low optical diffraction.
- Low optical index for a semi-conductor (~2.3 at 500 nm) which limits the optical reflections at the sapphire/GaN interface to ~1.5%.
- Very good resilience to optical flux for wavelengths below 0.4 μm (very weak absorption in the GaN layer since the energy of the photons is below the forbidden band energy, and very good thermal conductivity of GaN). In particular for the configurations which do not comprise any metallic part exposed (or exposable) to optical fluxes, such as a grid.
- Unequalled performance in terms of radiofrequency isolation for the configuration with grid. Indeed, in this type of configuration, the performance of the low-frequency grids is allied with the isolating power at high frequencies of the doped layers.
- Very high resistance to erosion of the reflecting face for the configurations without grid or with buried and therefore protected grid since GaN is a very hard material, comparable to sapphire. This may allow the use of the window with the epitaxied face at the front face (toward the exterior of the optronic system to be isolated).
- Ease of integration of the grid in the case of the configuration with grid, since GaN heterostructures are easy to etch with suitable microelectronics methods (RIE the acronym standing for the expression "Reactive Ion Etching", ICP the acronym standing for the expression "Inductively Coupled Plasma", etc.).

A porthole was produced in the following manner.

The sapphire substrate used is a circular substrate oriented along the c-axis [0001], 150 mm in diameter and 8 mm thick. One of the faces is polished with an optical quality. The other face is polished with an epi-ready quality.

On the epi-ready face, a buffer layer consisting of 20 nm of low temperature GaN followed by 2 μm of undoped high temperature $Al_{.27}Ga_{.73}N$ is deposited.

On this buffer layer, a network of 80 heterostructures of $GaN/Al_{.27}Ga_{.73}N$ (100/900 Å) is epitaxied. The GaN layers are not doped and the AlGaN layers are doped to $2.2.10^{18}$ cm$^3$. Undoped AlN layers 1 nm thick are used at the AlGaN/GaN interface so as to limit the effects of the interface roughness on the mobility of the electrons of the 2D gas; these AlN layers are an example of third layers SC3 of the heterostructures. The mobility of the carriers in the channels (and in the plane of the layers) is 1500 cm$^2$/V/s.

The network of heterostructures is open on 5 μm deep and 5 μm wide with a pattern of the grid type with the pitch of 400 μm. Over the whole of the periphery of the substrate, an opening 1000 μm wide is made over the whole of the epitaxied depth. In these two openings, an ohmic contact of Ti/Al/Mo/Au (150/600/350/500 Å) is deposited therein and then annealed. A second deposition of Ti/Au (150/500 Å) is deposited followed by an electrolytic recharge of Au to attain a thickness of 5 μm of Au and a contact width of 5 mm at the level of the peripheral contact.

Atop this structure, an antireflection layer of 275 nm of $MgF_2$ is deposited so as to optimize the transmission at 1.5 μm. An opening is made at the level of this $MgF_2$ layer so as to free access to the peripheral contact.

On the other face of the substrate, a multilayer dielectric treatment is deposited.

Figure 5A:
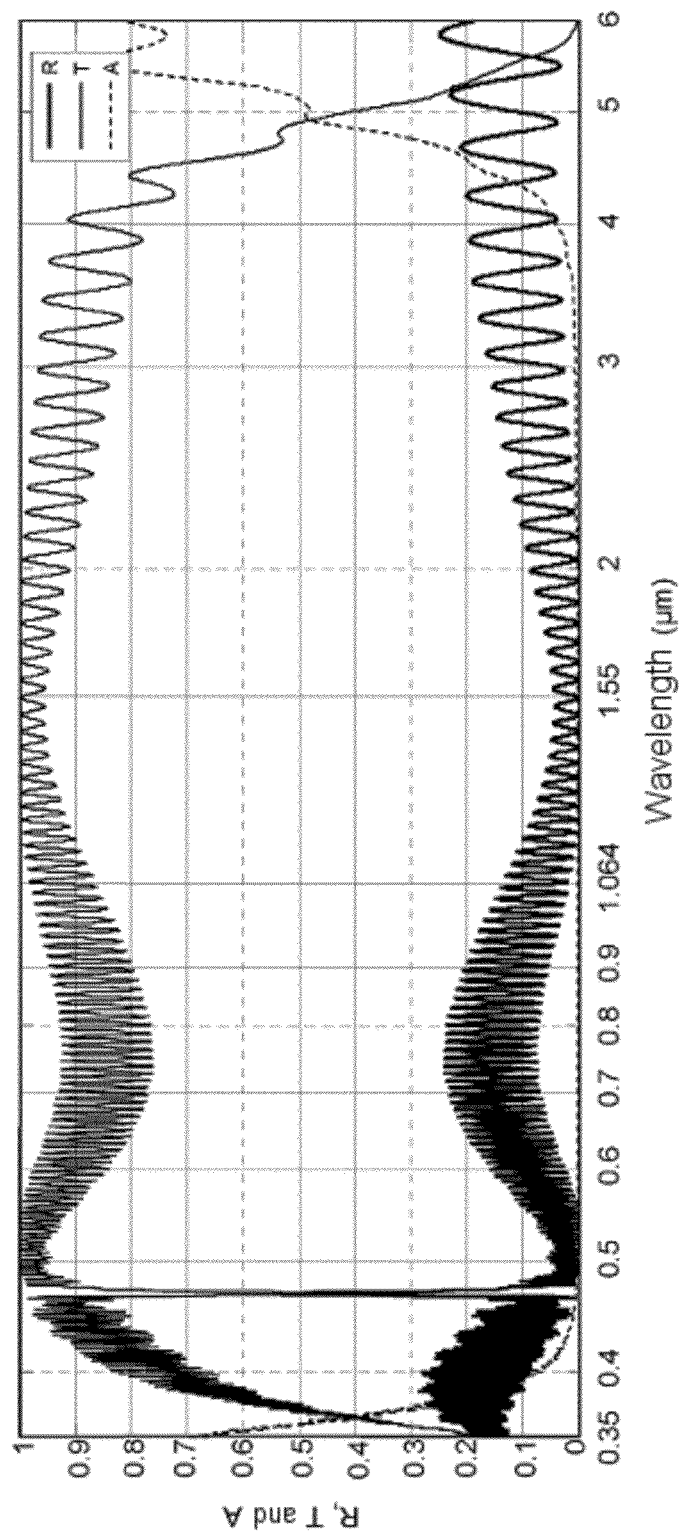

The following results were obtained:

At 4.5 μm, the absorption connected with the free carriers in the super network is 1.4%. The transparency, absorption and overall reflection properties of the structure are represented in FIG. 5a.

Figure 5B:
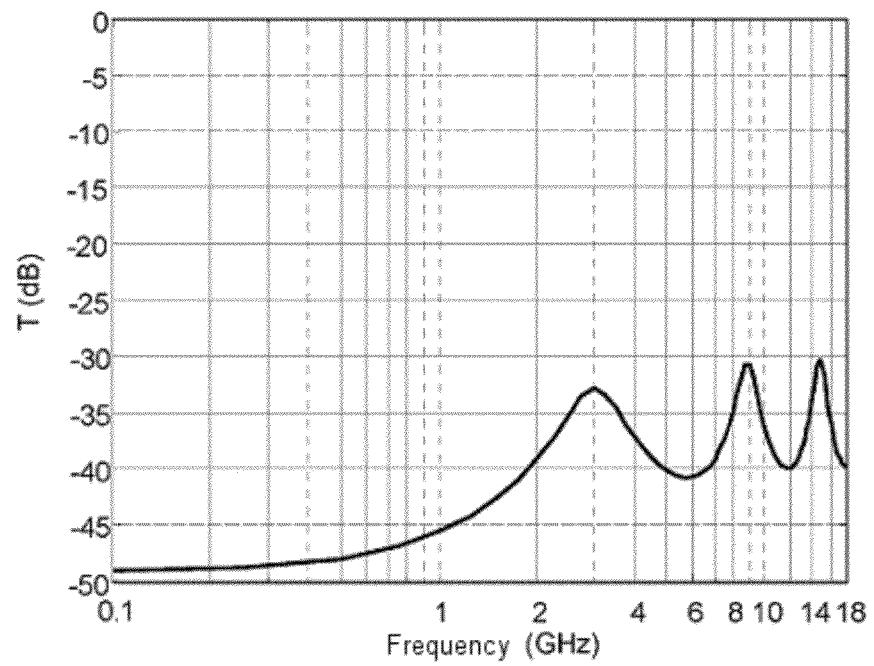
Figure 6:
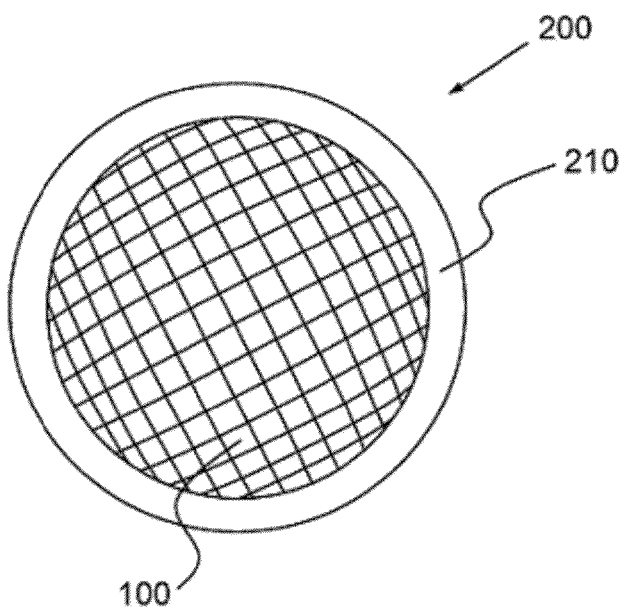

The surface resistivity of the structure obtained is 2.6 Ohm (sheet resistance), thereby making it possible to obtain RF transmission for a self-supporting equivalent layer of −37 dB. On the sapphire substrate, the RF transmission results are represented in FIG. 5b.

The invention claimed is:

1. An optronic porthole comprising:
a substrate with two faces, with on one of the faces of the substrate or on both faces, a stack of several hetero-structures, each hetero-structure being composed of at least two semi-conducting layers SC1, SC2, the layer SC1 being doped, the layer SC2 itself comprising a two-dimensional electron gas layer formed at the interface with the layer SC1, further comprising an electrode in contact with all the electron gas layers, a bi-periodic metallic grid buried in the stack, in contact with the electrode and the substrate and the layers are transparent in the 0.4 μm-5 μm band.

2. The optronic porthole as claimed in claim 1, wherein the grid has regular mesh cells.

3. The optronic porthole as claimed in claim 1, wherein the grid has a wire of thickness less than 5 μm and a pitch of less than 500 μm.

4. The optronic porthole as claimed in claim 1, wherein the semi-conducting layer SC2 is undoped.

5. The optronic porthole as claimed in claim 1, wherein the hetero-structures are of different thickness and/or are not composed of the same materials and/or do not comprise the same number of layers.

6. The optronic porthole as claimed in claim 1, further comprising a stack of 10 to 80 hetero-structures.

7. The optronic porthole as claimed in claim 1, further comprising a buffer layer between the substrate and the stack of hetero-structures.

8. The optronic porthole as claimed in claim 1, further comprising one or two antireflection layers.

9. The optronic porthole as claimed in claim 1, wherein the substrate is made of Sapphire or SiC or Si and the layer SC2 is made of GaN and the layer SC1 of AlGaN with an Al concentration of between 25 to 30%.

10. An optronic window comprising a porthole as claimed in claim 1, embedded in an electrically conducting mechanical structure, the electrode of the porthole being linked to this electrically conducting structure.

* * * * *